United States Patent
Ichikawa et al.

(10) Patent No.: US 11,362,246 B2
(45) Date of Patent: Jun. 14, 2022

(54) METHOD OF MANUFACTURING DISPLAY DEVICE WITH LATERAL WIRING

(71) Applicant: Nichia Corporation, Anan (JP)

(72) Inventors: Kinya Ichikawa, Anan (JP); Katsuyoshi Kadan, Katsuura-gun (JP); Masahiko Sano, Anan (JP); Ryohei Hirose, Itano-gun (JP); Hiroshi Yoneda, Anan (JP)

(73) Assignee: NICHIA CORPORATION, Anan (JP)

( * ) Notice: Subject to any disclaimer, the term of this patent is extended or adjusted under 35 U.S.C. 154(b) by 48 days.

(21) Appl. No.: 16/796,221

(22) Filed: Feb. 20, 2020

(65) Prior Publication Data

US 2020/0266326 A1    Aug. 20, 2020

(30) Foreign Application Priority Data

Feb. 20, 2019  (JP) .............................. JP2019-028727
Oct. 8, 2019   (JP) .............................. JP2019-184962

(51) Int. Cl.
  *H01L 33/62*  (2010.01)
  *H01L 33/38*  (2010.01)
  *H01L 25/075* (2006.01)

(52) U.S. Cl.
  CPC .......... *H01L 33/62* (2013.01); *H01L 25/0753* (2013.01); *H01L 33/382* (2013.01); *H01L 2933/005* (2013.01); *H01L 2933/0066* (2013.01)

(58) Field of Classification Search
  CPC .... H01L 33/62; H01L 33/382; H01L 25/0753
  See application file for complete search history.

(56) References Cited

U.S. PATENT DOCUMENTS 8,791,474  B1    7/2014  Bibi et al.
2013/0181249 A1  7/2013  Aoyagi et al.
(Continued)

FOREIGN PATENT DOCUMENTS

JP    2006-140247    6/2006
JP    2013-157496    8/2013
(Continued)

OTHER PUBLICATIONS

Office Action with Form PTO-892 Notice of References Cited issued by the United States Patent and Trademark Office for the co-pending U.S. Appl. No. 16/796,083, filed Apr. 30, 2021.
(Continued)

*Primary Examiner* — Ismail A Muse
*Assistant Examiner* — Gustavo G Ramallo
(74) *Attorney, Agent, or Firm* — Mori & Ward, LLP

(57) ABSTRACT

A method of manufacturing a display device 1 includes: providing a substrate including sub-pixel defined therein and a first wiring disposed for the sub-pixel, and light-emitting element having a lower surface and a lateral surface and including a first electrode disposed on the lower surface, and a second electrode disposed on the lateral surface; mounting the light-emitting element and electrically connecting the first electrode to the first wiring; forming a resin member on the substrate and covering the light-emitting element; exposing an upper portion of the light-emitting element from an upper surface of the resin member such that the second electrode is partially exposed by removing an upper portion of the resin member; and forming a second wiring on the upper surface of the resin member excluding a portion of the light-emitting element exposed from the resin member and electrically connecting the second wiring to the second electrode.

13 Claims, 9 Drawing Sheets

(56) References Cited

U.S. PATENT DOCUMENTS

| | | |
|---|---|---|
| 2014/0124731 A1 | 5/2014 | Jeong |
| 2014/0267683 A1 | 9/2014 | Bibi et al. |
| 2014/0367705 A1* | 12/2014 | Bibi .................. H01L 27/0203 |
| | | 257/88 |
| 2016/0027973 A1 | 1/2016 | Maki |
| 2017/0069611 A1 | 3/2017 | Zhang et al. |
| 2017/0069681 A1 | 3/2017 | Lee et al. |
| 2017/0125392 A1 | 5/2017 | Bibi et al. |
| 2019/0156093 A1 | 5/2019 | Kim et al. |
| 2020/0052160 A1 | 2/2020 | Li et al. |
| 2020/0098963 A1* | 3/2020 | Maeda .................. H01L 33/36 |
| 2020/0168777 A1 | 5/2020 | Kang |
| 2021/0147631 A1 | 5/2021 | Reit et al. |

FOREIGN PATENT DOCUMENTS

| | | |
|---|---|---|
| JP | 2013-258371 | 12/2013 |
| JP | 2018-10309 | 1/2018 |
| WO | WO 2018/082101 | 5/2018 |

OTHER PUBLICATIONS

Office Action issued by the United States Patent and Trademark Office for the co-pending U.S. Appl. No. 16/796,083, filed Sep. 22, 2021.

Advisory Action with Form PTO-892 Notice of References Cited issued by the United States Patent and Trademark Office for the co-pending U.S. Appl. No. 16/796,083, filed Nov. 26, 2021.

Office Action with Form PTO-892 Notice of References Cited issued by the United States Patent and Trademark Office for the co-pending U.S. Appl. No. 16/796,083, filed Jan. 11, 2022.

\* cited by examiner

US 11,362,246 B2

METHOD OF MANUFACTURING DISPLAY DEVICE WITH LATERAL WIRING

CROSS-REFERENCE TO RELATED APPLICATION

This application claims priority to Japanese Patent Application No. 2019-028727 filed on Feb. 20, 2019, and Japanese Patent Application No. 2019-184962 filed on Oct. 8, 2019, the disclosures of which are hereby incorporated by reference in their entireties.

BACKGROUND

The present disclosure relates to a display device and a method of manufacturing a display device.

A display device that uses micro light-emitting diodes (i.e., micro-LEDs) for pixels has been proposed as described in Japanese Patent Publication No. 2006-140247. This type of display devices in which the pixels are configured as self-luminescent elements provides higher resolution, higher contrast, and higher color reproducibility than display devices with a liquid-crystal panel. Also, typical micro-LEDs are formed of inorganic semiconductor materials, thereby having a longer lifetime than organic electro-luminescence elements, and being less likely to cause burn-in.

In a display device using micro-LEDs, light is extracted from an upper surface of the light-emitting element. In addition, the upper surface, as well as a lower surface of the light-emitting element, is needed to be connected to wirings. Thus, the upper surface of the light-emitting element needs to have both a high electrical-conductivity and a high light transmissivity. As a result, in a production line of the display device with micro-LEDs, mounting of the light-emitting element to a substrate becomes difficult, which increases the manufacturing cost.

SUMMARY

Certain embodiments are made in view of the above-mentioned current situation, and have objects to provide a display device that includes micro-LEDs as pixels and can be manufactured at low cost and a method of manufacturing a display device.

A method of manufacturing a display device according to certain embodiment of the present invention includes: providing a substrate and at least one light-emitting element, wherein the substrate includes at least one sub-pixel and a first wiring disposed for the sub-pixel, and the at least one light-emitting element includes a lower surface, a lateral surface, a first electrode disposed on the lower surface, and a second electrode disposed on at least a portion of the lateral surface; mounting the at least one light-emitting element on the substrate and electrically connecting the first electrode to the first wiring; forming a resin member on the substrate and covering the at least one light-emitting element; exposing an upper portion of the at least one light-emitting element from an upper surface of the resin member such that a portion of the second electrode is exposed by removing an upper portion of the resin member; and forming a second wiring on a region of the upper surface of the resin member excluding a portion of the at least one light-emitting element exposed from the resin member and electrically connecting the second wiring to the second electrode.

A display device according to certain embodiment of the present invention includes a substrate in which at least one sub-pixel is defined, a first wiring disposed for the at least one sub-pixel on the substrate, at least one light-emitting element mounted for the at least one sub-pixel on the substrate, a resin member covering a lower portion of the at least one light-emitting element and the first wiring, and a second wiring disposed on the resin member. The at least one light-emitting element includes: a semiconductor having a lower surface and a lateral surface; a first electrode disposed on the lower surface and electrically connected to the first wiring; and a second electrode disposed on at least a portion of the lateral surface, a portion of the second electrode being exposed from an upper surface of the resin member. At least a portion of the at least one light-emitting element is not covered with the second wiring. The second wiring is electrically connected to the portion of the second electrode that is exposed from the resin member.

Certain embodiments of the present disclosure allow for providing a display device that includes micro-LEDs as pixels and can be manufactured at low cost, and a method of manufacturing a display device.

EMBODIMENTS

First Embodiment

Figure 1:
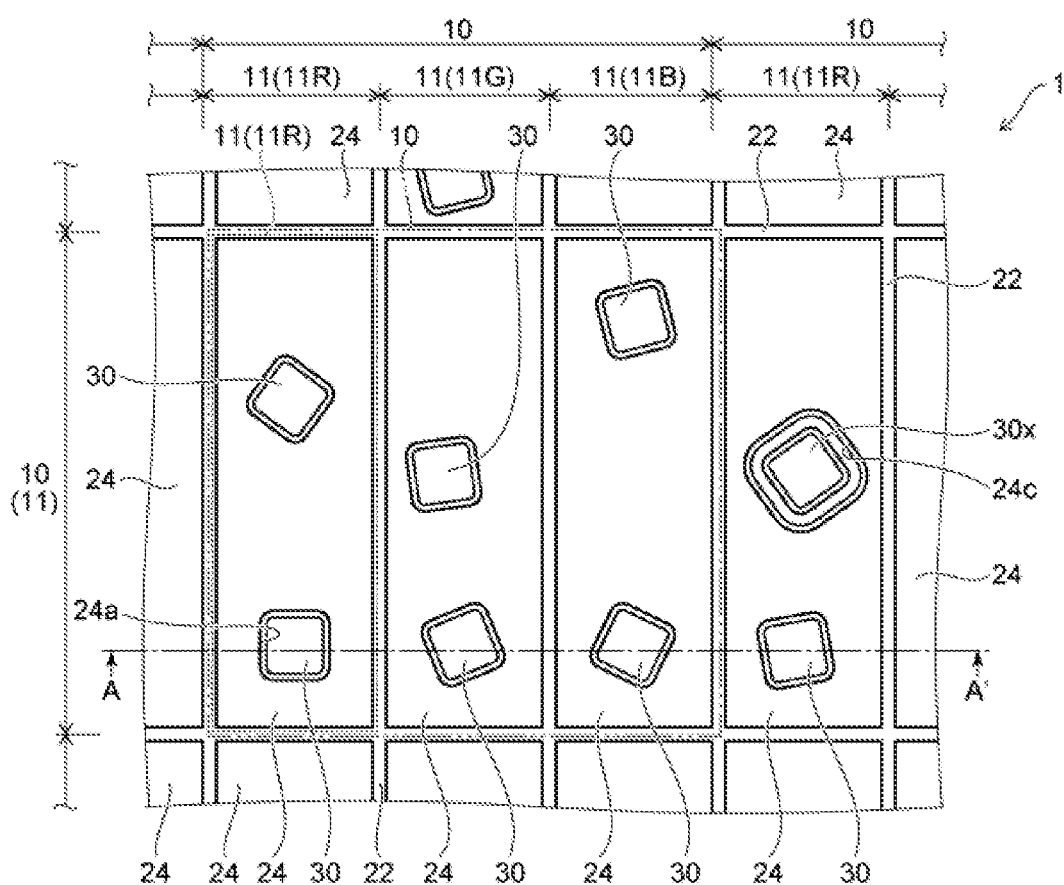
FIG. 1 is a schematic top view illustrating a display device according to a first embodiment.

First, a first embodiment will be described.

A display device 1 according to the present embodiment includes a substrate 20, a plurality of first wirings 21 disposed for each of sub-pixels 11 on the substrate 20, at least one light-emitting element 30 mounted for each of the sub-pixels 11 on the substrate 20, a resin member 23 covering a lower portion of the light-emitting element 30 and the first wirings 21, and a second wiring 24 disposed on the resin member 23. The light-emitting element 30 includes a semiconductor member 31, a first electrode 35 disposed on a lower surface 31a of the semiconductor member 31 and electrically connected to the first wiring 21, and a second electrode 33 disposed on at least a portion of a lateral surface 31b of the semiconductor member 31 and partly exposed from an upper surface 23a of the resin member 23. At least a portion of the light-emitting element 30 is not covered with the second wiring 24. The second wiring 24 is electrically connected to a portion of the second electrode 33 that is exposed from the resin member 23.

Configurations of the display device 1 will be described below in detail.

Figure 2A:
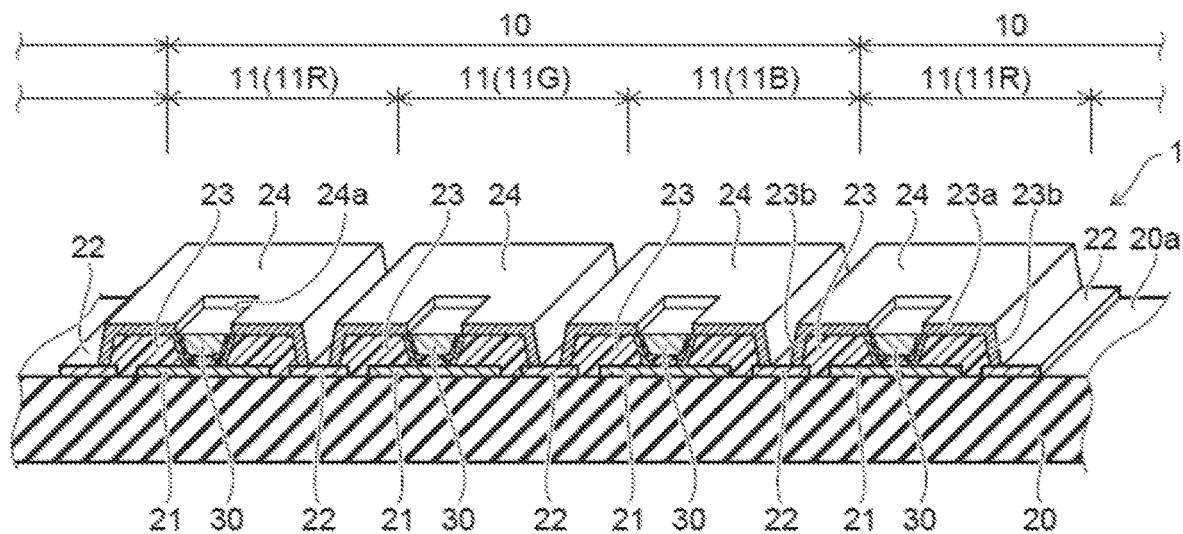
FIG. 2A is a schematic end view taken along the line A-A' in FIG. 1.
Figure 2B:
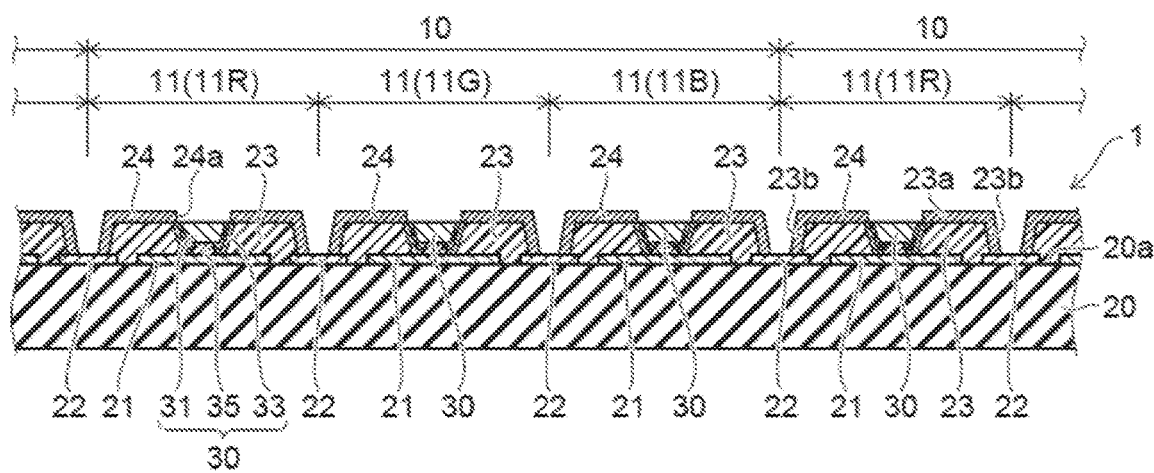
FIG. 2B is a schematic end view taken along the line A-A' in FIG. 1.

As shown in FIGS. 1, 2A, and 2B, the substrate 20 is provided in the display device 1 according to the present embodiment. The substrate 20 includes wirings disposed in an insulating base material. Also, an active-matrix transistor is formed on the substrate 20. The active-matrix transistor is a switching element that determines whether to supply power to the light-emitting elements 30 or not in each sub-pixel 11.

A plurality of pixels 10 are defined in the substrate 20. The pixels 10 are arranged along a first direction and a second direction orthogonal to the first direction to form a matrix shape. One or more, for example, three sub-pixels 11 are defined in each pixel 10. For example, three sub-pixels 11 in each pixel 10 include a sub-pixel 11R that emits red light, a sub-pixel 11G that emits green light, and a sub-pixel 11B that emits blue light. The number of sub-pixels 11 included in each pixel 10 is not limited to three. In FIG. 1, an outer edge of single pixel 10 is indicated by a double-dot chain line. An outer edge of single sub-pixel 11R is indicated by a dashed line.

The first wirings 21 are disposed on the substrate 20. The first wirings 21 each have an isolated island-shape in each sub-pixel 11 in a top view and is electrically connected to the wirings of the substrate 20. An electrode 22 is disposed between the sub-pixels 11 on the substrate 20. The electrode 22 has, for example, a shape of grid-like pattern in a top view. The first wiring 21 and the electrode 22 include metals. For example, the first wiring 21 and the electrode 22 are formed of a metal material as a main material having the same electro-conductivity. The first wiring 21 and the electrode 22 contain, for example, silver (Ag) or copper (Cu). For example, the first wiring 21 and the electrode 22 are made of silver or copper. For example, the first wiring 21 has substantially the same thickness as the thickness of the electrode 22. Light reflectance on a surface of the electrode 22 is preferably lower than light reflectance on a surface of the first wiring 21. This may reduce brightness in a region between the sub-pixels 11, and improve a contrast of a screen. In order to reduce the light reflectance on the surface of the electrode 22, roughening and/or black film forming can be performed thereon, for example.

The one or more light-emitting elements 30 are each disposed on the first wiring 21. The light-emitting elements 30 are mounted on the substrate 20 via the first wiring(s) 21. The light-emitting elements 30 are micro-LEDs. The micro-LED has, for example, a quadrangular shape with a side length of approximately 5 μm to 100 μm, preferably of 10 μm to 50 μm, in a top view. Each sub-pixel 11 includes one or more, preferably two or more light-emitting elements 30. For example, each sub-pixel 11 includes two light-emitting elements 30. As an example, the sub-pixel 11R includes the light-emitting elements 30 that emit red light, the sub-pixel 11G includes the light-emitting elements 30 that emit green light, and the sub-pixel 11B includes the light-emitting elements 30 that emit blue light. One or more of the light-emitting elements 30 can be disposed in each sub-pixel 11, and are not necessarily arranged along a single direction.

The resin member 23 is disposed for each sub-pixel 11 on the substrate 20. The resin member 23 is formed of an insulating resin material as a main material. The resin member 23 has, for example, a substantially rectangular parallelepiped shape or a truncated quadrangular pyramid. The resin member 23 separately covers entirety of the first wirings 21. The light-emitting element 30 has the lower portion covered with the resin member 23 and an upper portion exposed from the upper surface 23a of the resin member 23. The electrode 22 has end portions in the width direction, both of which are covered with the resin member 23. The electrode 22 has a central portion in the width direction, the central portion being exposed from the resin member 23.

Each sub-pixel 11 includes the second wiring 24 to cover the resin member 23. The second wiring 24 is disposed on the upper surface 23a and a lateral surface 23b of the resin member 23. The second wiring 24 is not disposed on at least a portion on the upper surface 23a of the resin member 23 where each light-emitting element 30 is exposed. The second wiring 24 has peripheral end portions that are connected to the electrode 22. This configuration can allow all second wirings 24 to be connected each other via the electrode 22.

For example, an opening 24a is formed in the second wiring 24 at a region that corresponds to the light-emitting element 30. In the opening 24a, an upper surface of the light-emitting element 30 is exposed excluding a perimeter portion of the light-emitting element 30. Hence, at least a portion of the light-emitting element 30 is not covered with the second wiring 24. Also, a portion of the second wiring 24 excluding the opening 24a is disposed continuously on the upper surface 23a and the lateral surface 23b of the resin member 23. With this configuration, a portion of the lateral surface of the light-emitting element 30 is in contact with the second wiring 24.

Configurations of the light-emitting element 30 will be described below in detail.

Figure 3A:
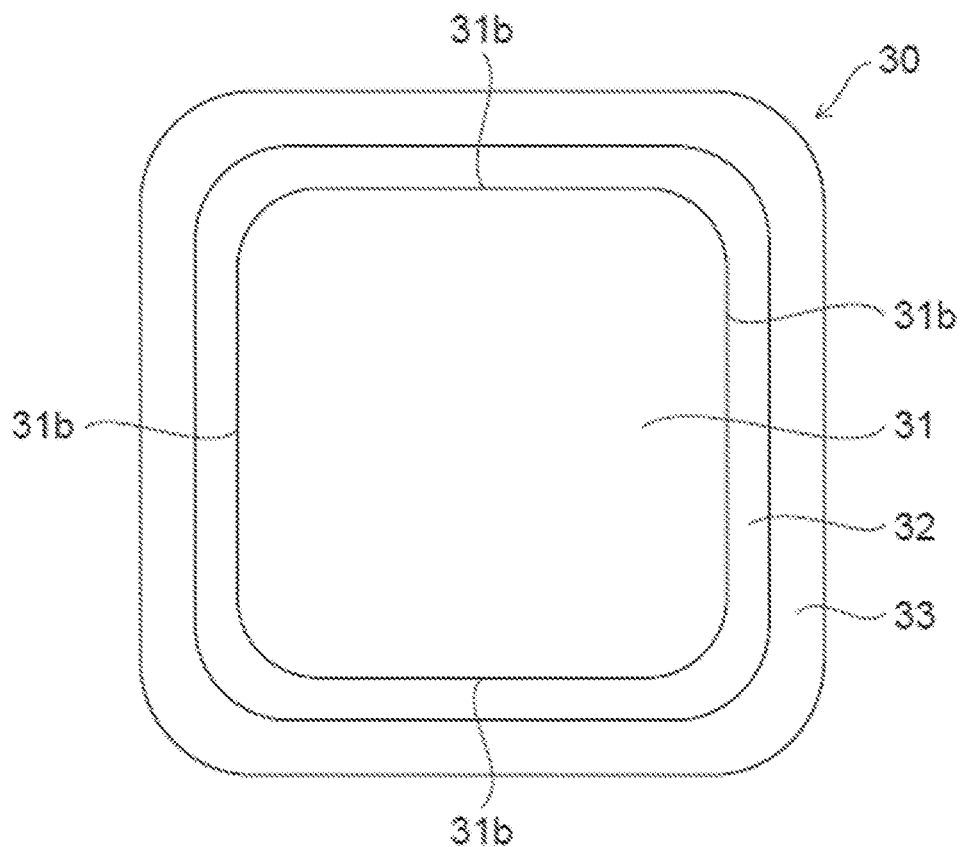
FIG. 3A is a schematic top view illustrating a light-emitting element of the display device according to the first embodiment.
Figure 3B:
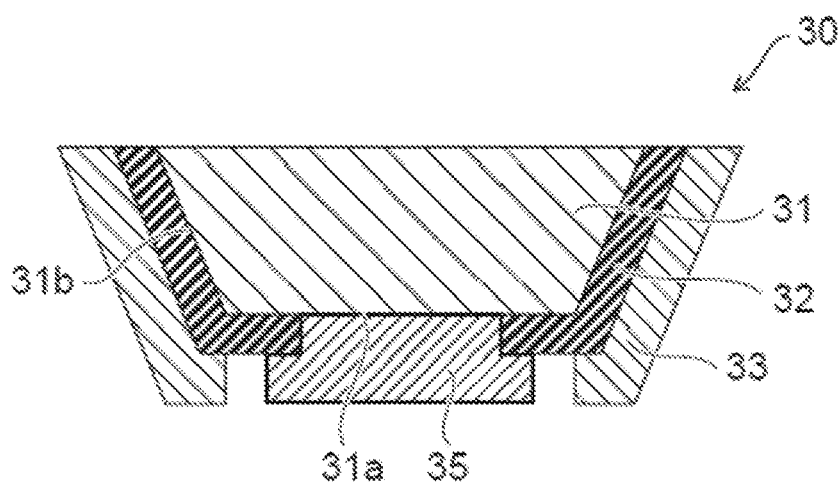
FIG. 3B is a schematic end view illustrating the light-emitting element of the display device according to the first embodiment.
Figure 4A:
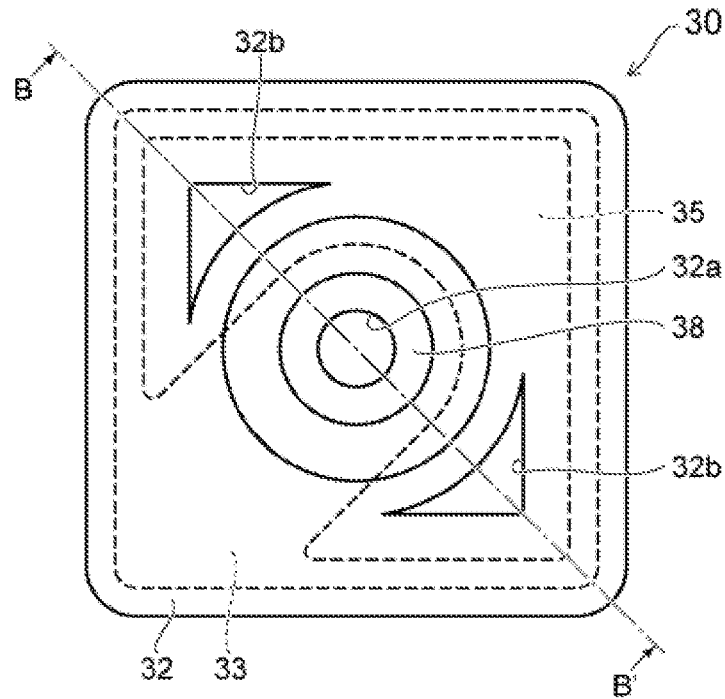
FIG. 4A is a schematic plan view illustrating the light-emitting element of the display device according to the first embodiment.
Figure 4B:
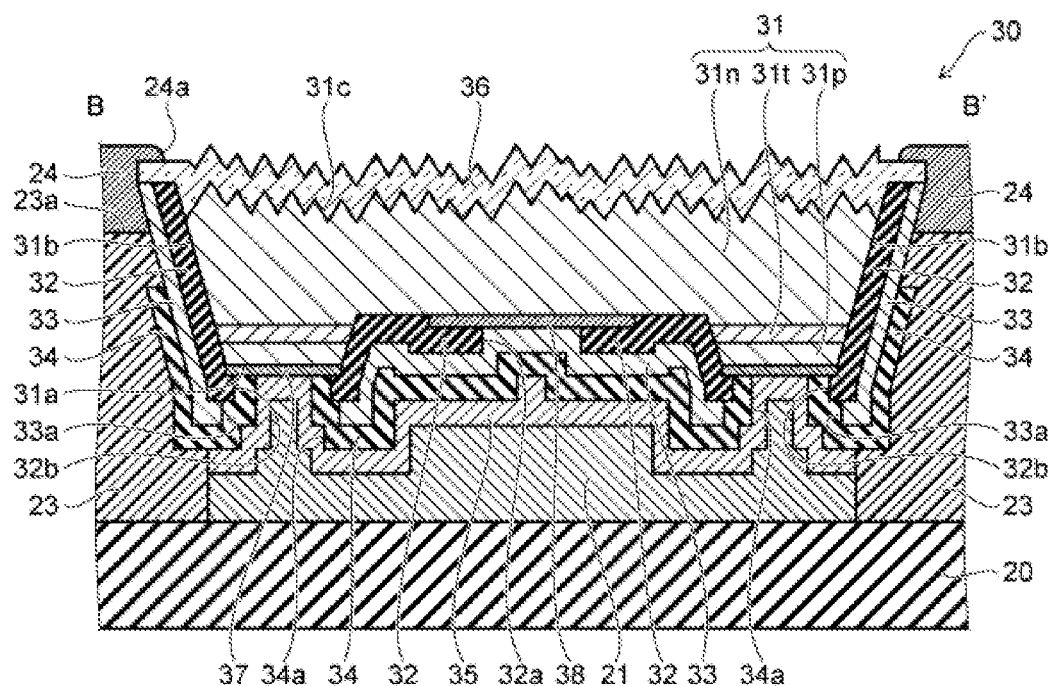
FIG. 4B is a schematic end view taken along the line B-B' in FIG. 4A.
Figure 5A:
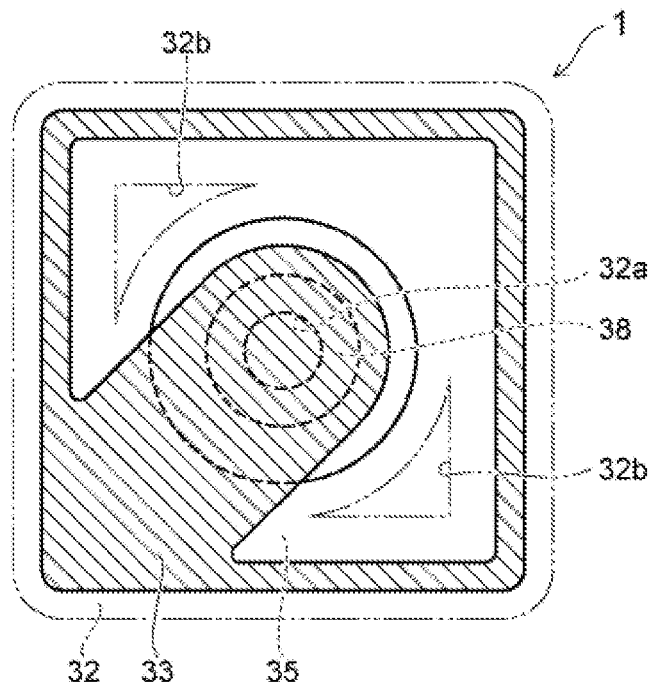
FIG. 5A is a schematic plan view illustrating a second electrode of the light-emitting element of the display device according to the first embodiment.
Figure 5B:
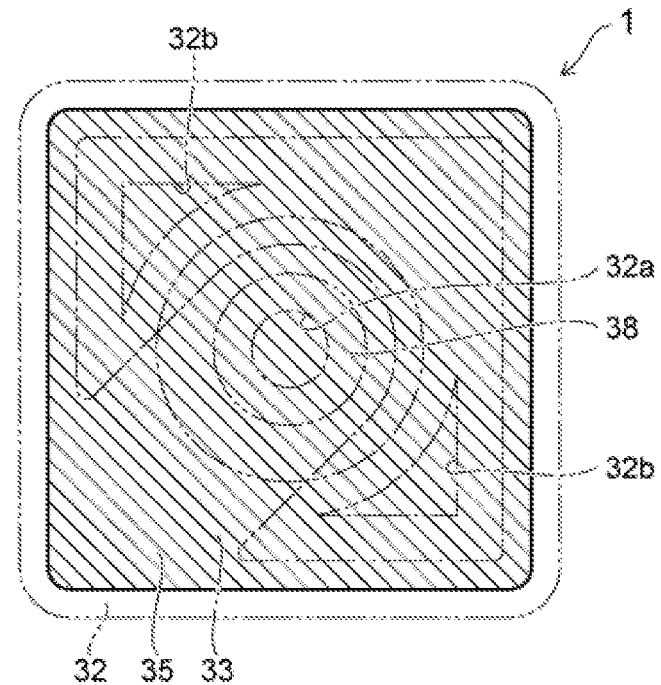
FIG. 5B is a schematic plan view illustrating a first electrode of the light-emitting element of the display device according to the first embodiment.
Figure 10:
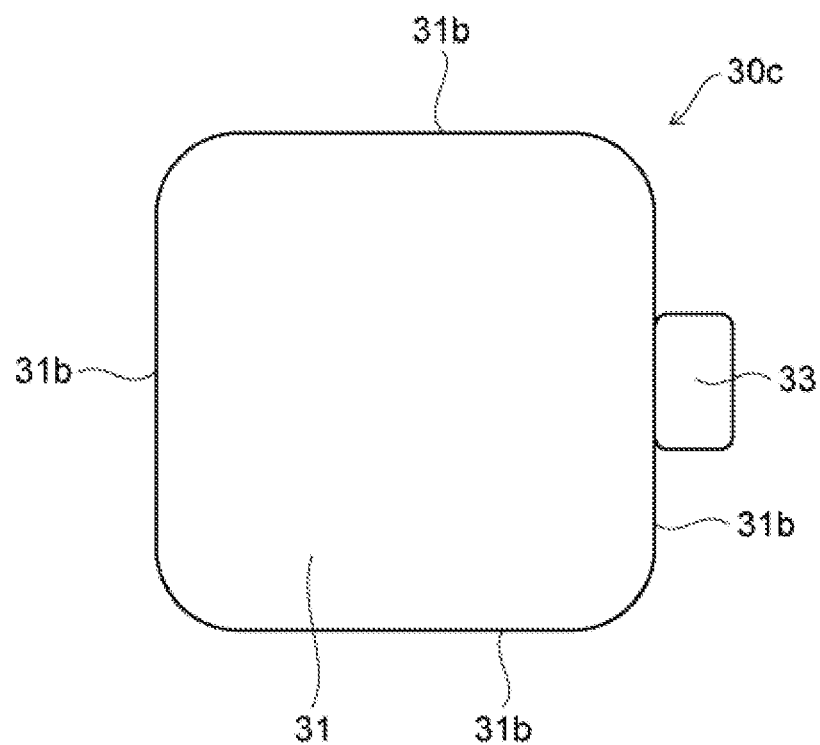
FIG. 10 is a schematic top view illustrating a light-emitting element of a display device according to a fourth embodiment.

As shown in FIGS. 3A, 3B, 4A, 4B, 5A, and 5B, the light-emitting element 30 includes the semiconductor member 31, a light reflective layer 32, the second electrode 33, an insulating layer 34, the first electrode 35, a protective layer 36, a first conductive layer 37, and a second conductive layer 38. The light-emitting element 30 has, for example, a quadrangular shape in a top view. FIGS. 3A and 3B are schematic diagrams illustrating only the semiconductor member 31, the first electrode 35, the second electrode 33, and the light reflective layer 32 simplistically, and other components are omitted. FIG. 10 shown below is drawn in the same manner as above. FIGS. 5A to 5B are diagrams illustrating the configuration of the light-emitting element 30 in detail. For easy understanding, in FIG. 5A, the second electrode 33 is shown with hatching. In FIG. 5B, the first electrode 35 is shown with hatching. In FIGS. 4A, 5A, and 5B, the semiconductor member 31 is omitted.

The semiconductor member 31 has, for example as shown in FIG. 4B, a nearly reversed truncated quadrangular pyramid with the lower surface 31a, four lateral surfaces 31b, and an upper surface 31c. For example, the upper surface 31c is roughened. The semiconductor member 31 includes a first semiconductor layer 31p, a light-emitting layer 31t, and a second semiconductor layer 31n. The first conductive layer 37 is disposed on a lower surface of the first semiconductor layer 31p. The second conductive layer 38 is disposed, for example, at a central portion of a lower surface of the second semiconductor layer 31n.

The insulating light reflective layer 32 is disposed on the lower surface 31a and the lateral surface 31b of the semiconductor member 31. The light reflective layer 32 is, for example, a distributed Bragg reflector (DBR) layer that includes a multilayer structure of, for example, niobium oxide (NbO) and aluminum oxide (AlO) layered alternately with each other. Openings 32a and 32b are formed at portions of the light reflective layer 32, the portions being positioned under the semiconductor member 31. The opening 32a is, for example, formed at a region that includes a center of the lower surface 31a, and has, for example a circular shape as seen from a bottom. The second conductive layer 38 is disposed in the opening 32a as seen from a bottom. The openings 32b are, for example, formed near two corners of the lower surface 31a that are diagonally opposite to each other, and each have, for example, a substantially isosceles right triangle with a curved hypotenuse in a recessed circular arc shape. The first semiconductor layer 31p and the light-emitting layer 31t of the semiconductor member 31 and the first conductive layer 37 are positioned only within the opening 32b as seen from a bottom, whereas the second semiconductor layer 31n of the semiconductor member 31 is positioned in a whole area surrounded by the light reflective layer 32 as seen from a bottom.

The second electrode 33 is disposed outside the light reflective layer 32. That is, the second electrode 33 is disposed on the lower surface 31a and the lateral surfaces 31b of the semiconductor member 31 via the light reflective layer 32. In other words, the light reflective layer 32 is disposed between the second electrode 33 and the lower surface 31a of the semiconductor member 31 as well as between the second electrode 33 and the lateral surfaces 31b. The second electrode 33 reaches to an upper end of the lateral surface 31b of the semiconductor member 31. A portion of the second electrode 33 is exposed from the upper surface 23a of the resin member 23. The second electrode 33 is formed of metal materials such as silver or aluminum as a main material.

A portion of the second electrode 33 corresponding to the opening 32a protrudes upward to enter the opening 32a of the light reflective layer 32. The second electrode 33 is electrically connected to the second conductive layer 38 via the opening 32a of the light reflective layer 32. The second conductive layer 38 is electrically connected to the second semiconductor layer 31n of the semiconductor member 31 at the lower surface 31a of the semiconductor member 31. On the other hand, openings 33a are formed at portions of the second electrode 33 corresponding to the openings 32b of the light reflective layer 32. That is, the second electrode 33 is not disposed at regions directly below the openings 32b.

In the present embodiment, the second electrode 33 has a substantially cup shape that substantially surrounds surfaces of the semiconductor member 31 excluding the upper surface 31c. The second electrode 33 is disposed around the semiconductor member 31 in a top view. That is, the second electrode 33 is disposed on all four lateral surfaces 31b of the semiconductor member 31. As will be described below, it suffices that the second electrode 33 is disposed only on at least a portion of the lateral surfaces 31b of the semiconductor member 31. Also, the second electrode 33 is disposed at a region corresponding to the opening 32a of the light reflective layer 32 at the lower surface 31a of the semiconductor member 31, and this region is continuous to a portion of the second electrode 33 disposed on the lateral surface 31b.

The insulating layer 34 is disposed to cover a lower portion of the second electrode 33. A portion of the insulating layer 34 corresponding to the opening 32a of the light reflective layer 32 protrudes upward so as to enter the opening 32a. On the other hand, openings 34a are formed at portions of the insulating layer 34 corresponding to the openings 32b of the light reflective layer 32. That is, the insulating layer 34 is not disposed at regions directly below the openings 32b. An upper end of the insulating layer 34 is located lower than an upper end of the second electrode 33. Hence, the insulating layer 34 does not cover an upper portion of the second electrode 33. With the insulating layer 34 not covering the upper portion of the second electrode 33, the second electrode 33 can be electrically connected to the second wiring 24, as will be described below.

The first electrode 35 is disposed under the insulating layer 34. The first electrode 35 is formed of metal materials as a main material that includes, for example, silver or copper. For example, the first electrode 35 can be made of silver or copper. The first electrode 35 is disposed on substantially a whole area of the lower surface 31a of the semiconductor member 31 via the light reflective layer 32, the second electrode 33, and the insulating layer 34. The first electrode 35 has a portion corresponding to the opening 32a of the light reflective layer 32 protrudes upward so as to enter the opening 32a, and portions corresponding to the openings 32b of the light reflective layer 32 protrude upward so as to enter the openings 32b. The first electrode 35 is electrically connected to the first conductive layer 37 via the openings 34a of the insulating layer 34, the openings 33a of the second electrode 33, and the openings 32b of the light reflective layer 32. The first conductive layer 37 is electrically connected to the first semiconductor layer 31p of the semiconductor member 31 at the lower surface 31a of the semiconductor member 31. The protective layer 36 is disposed on the upper surface 31c of the semiconductor member 31.

The first electrode 35 is electrically connected to the first wiring 21 at a lower surface of the light-emitting element 30. In the light-emitting element 30, the first semiconductor layer 31p of the semiconductor member 31 is connected to the active-matrix transistor via the first conductive layer 37, the first electrode 35, the first wiring 21, and wirings in the substrate 20. The second semiconductor layer 31n is connected to the second electrode 33 via the second conductive layer 38. At an upper portion of the light-emitting element 30, a portion of the second electrode 33 which is exposed from the upper surface 23a of the resin member 23 is electrically connected to the second wiring 24. This can provide power supply between the first semiconductor layer 31p and the second semiconductor layer 31n of the semiconductor member 31.

As shown in FIG. 1, a disconnection portion 24c can be formed at the second wiring 24 of the display device 1. The disconnection portion 24c has a frame shape that surrounds a defective light-emitting element 30x. The second wiring 24 is separated into portions disposed inside and outside the disconnection portion 24c. This configuration can allow the defective light-emitting element 30x to be disconnected from the second wiring 24. The types of defects of the defective light-emitting element 30x include, for example, short-circuit, disconnection, and unstable conduction.

Next, the method of manufacturing the display device according to the present embodiment will be described.

FIGS. 6A to 7C are schematic end views illustrating the method of manufacturing the display device according to the present embodiment.

Providing Substrate 20 and Light-Emitting Element 30

Figure 6A:
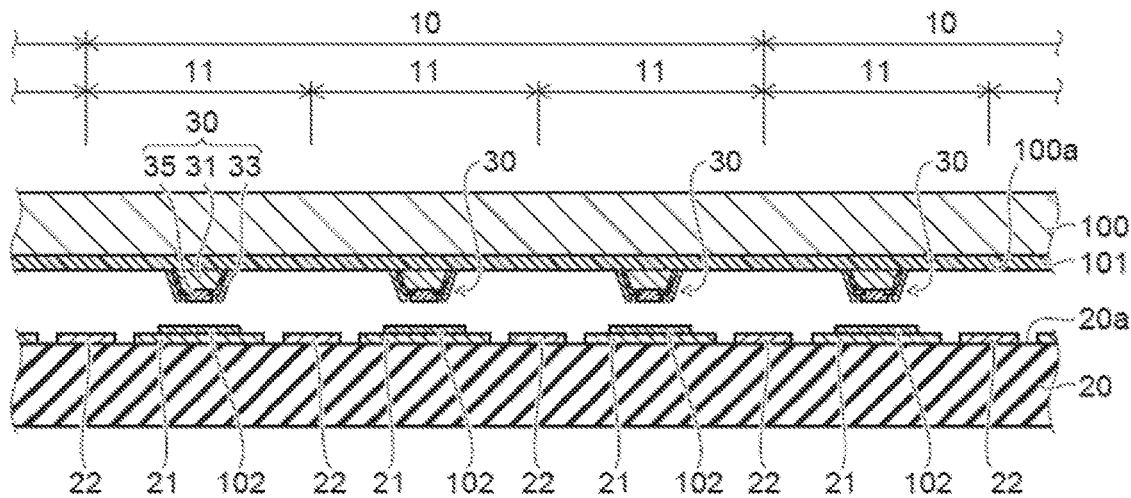
FIG. 6A is a schematic end view illustrating a method of manufacturing the display device according to the first embodiment.

First, the substrate 20 and the light-emitting element 30 are provided as shown in FIG. 6A. In the substrate 20, pixels 10 are defined in a matrix shape. Each of the pixels 10 includes one or more sub-pixels 11. On the upper surface 20a of the substrate 20, the first wirings 21 are disposed for each sub-pixel 11. The electrode 22 is disposed between the sub-pixels 11. An electro-conductive paste layer 102 is disposed on the first wirings 21.

The light-emitting element 30 is, for example, bonded to a lower surface 100a of a supporting substrate 100 via an adhesive sheet 101. For example, two light-emitting elements 30 are bonded on a region of the supporting substrate 100 that corresponds to each sub-pixel 11. One or more, preferably two or more light-emitting elements 30 are included in each of the sub-pixel 11. The configuration of the light-emitting element 30 is described as above. That is, the first electrode 35 configures the lower surface of the light-emitting element 30, and the second electrode 33 configures at least a portion of the lateral surface, for example, four lateral surfaces.

Mounting Light-Emitting Element 30 on Substrate 20 and Connecting First Electrode 35 to First Wiring 21

Figure 6B:
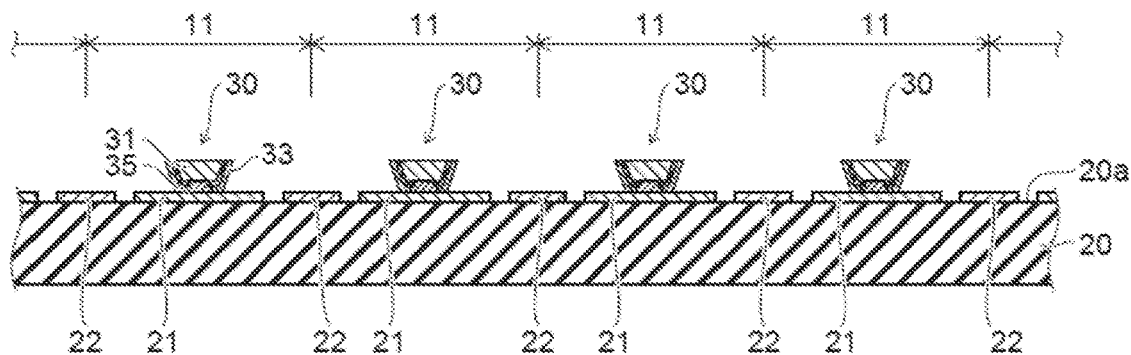
FIG. 6B is a schematic end view illustrating the method of manufacturing the display device according to the first embodiment.

Next, as shown in FIGS. 6A and 6B, the light-emitting element 30 is brought into contact with the electro-conductive paste layer 102 so as to be bonded to the lower surface 100a of the supporting substrate 100 while the lower surface 100a faces the upper surface 20a of the substrate 20. Then, the electro-conductive paste layer 102 is sintered. This allows the first electrode 35 of the light-emitting element 30 to be electrically connected to the first wiring 21, and the light-emitting element 30 is mounted on the substrate 20. Hereinafter, the electro-conductive paste layer 102 is shown as a portion of the first wiring 21.

Subsequently, the adhesive sheet 101 is removed by, for example, dissolving. This allows the supporting substrate 100 to be detached from the light-emitting element 30. Hence, the light-emitting element 30 is transferred from the supporting substrate 100 to the substrate 20. At this time, for example, two light-emitting elements 30 are mounted on each sub-pixel 11. The light-emitting element 30 has, for example, a quadrangular shape in a top view.

Forming Resin Member 23

Figure 7A:
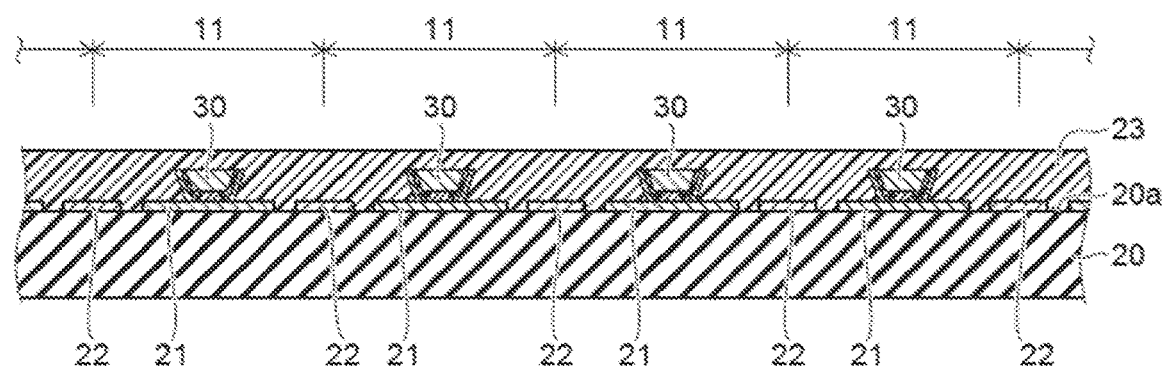
FIG. 7A is a schematic end view illustrating the method of manufacturing the display device according to the first embodiment.

Subsequently, as shown in FIG. 7A, the resin member 23 is formed on the substrate 20 to cover the light-emitting element 30. For example, a photosensitive resin is applied on the upper surface 20a of the substrate 20, then the photosensitive resin is developed and cured. Alternatively, a dry film formed of a photosensitive resin is attached to the upper surface 20a of the substrate 20. The resin member 23 is thus formed. At this time, the resin member 23 entirely covers the plurality of light-emitting elements 30 that are mounted on the plurality of sub-pixels 11.

Exposing Second Electrode 33 from Resin Member 23

Figure 7B:
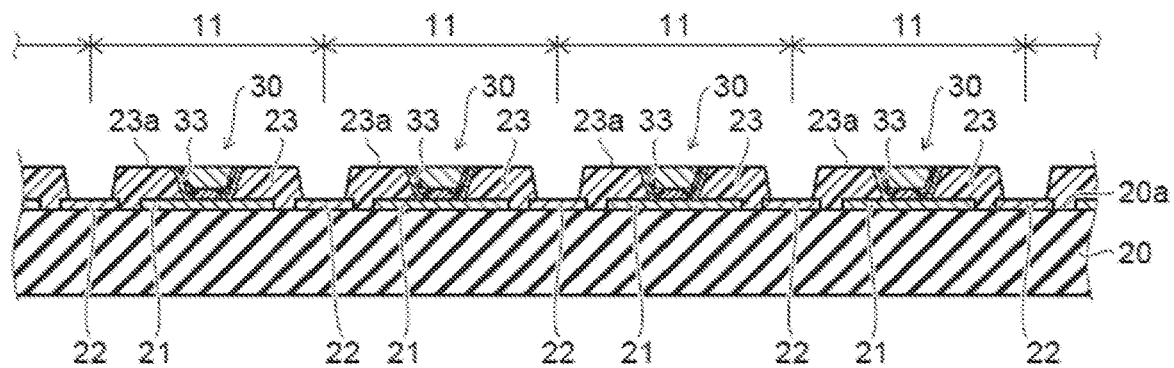
FIG. 7B is a schematic end view illustrating the method of manufacturing the display device according to the first embodiment.

Subsequently, as shown in FIG. 7B, etching such as reactive ion etching (RIE) using oxygen ($O_2$) is performed on the upper surface 23a of the resin member 23, so as to remove an upper portion of the resin member 23. This allows the upper portion of the light-emitting element 30 including an upper portion of the second electrode 33 to be exposed from the upper surface 23a of the resin member 23. At this time, the resin member 23 is divided for each sub-pixel 11 to expose the electrode 22. Thus, the resin member 23 has, for example, a substantially rectangular parallelepiped shape or a truncated quadrangular pyramid.

Forming Second Wiring 24 on Resin Member 23

Figure 7C:
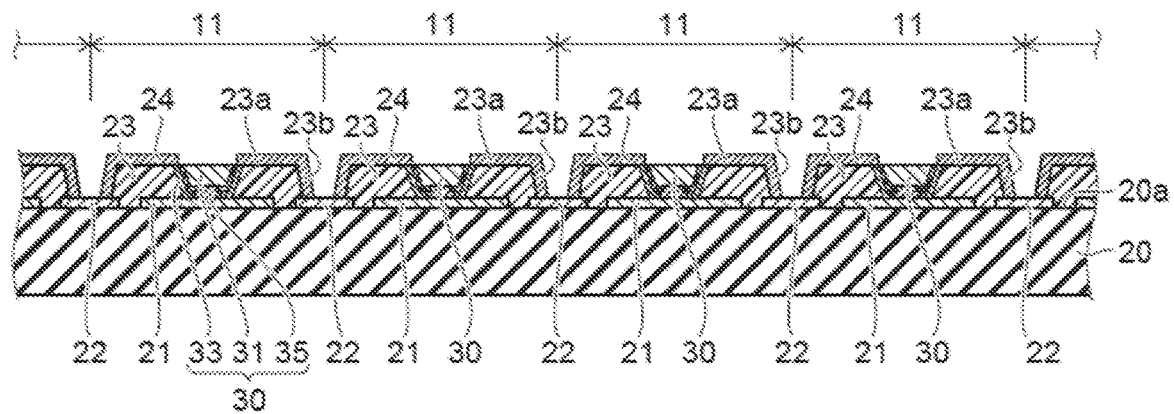
FIG. 7C is a schematic end view illustrating the method of manufacturing the display device according to the first embodiment.

Subsequently, as shown in FIG. 7C, the second wiring 24 is formed on the lateral surfaces 23b of the resin member 23 and a region of the upper surface 23a excluding a portion in which the light-emitting element 30 is exposed. The second wiring 24 has, for example, a planer shape and entirely covers, for example, the upper surface 23a and the lateral surfaces 23b of the resin member 23 excluding an exposed portion of the light-emitting element 30. The second wiring 24 is formed, for example, by applying an electro-conductive paste on the whole surface using spin coating and then sintering. Then, a resist pattern is formed by photolithography. In the resist pattern, an opening is formed at a region directly above the light-emitting element 30. Then, an etching process such as reactive ion etching (RIE) is performed by using the resist pattern as a mask. This allows a portion of the second wiring 24 that covers the light-emitting element 30 to be removed, and thus the opening 24a is formed. Alternatively, the opening 24a can be formed by forming a resist pattern that covers the light-emitting element 30, forming the second wiring 24 on the whole surface, and lifting off a portion of the second wiring 24 that is positioned directly above the light-emitting element 30.

Thus, the second wiring 24 is in contact with and electrically connected to the second electrode 33 of each light-emitting element 30 at a portion exposed from the upper surface 23a of the resin member 23. Also, the second wiring 24 is in contact with and electrically connected to the electrode 22. Consequently, the second wirings 24 connects the second electrodes 33 of all the light-emitting elements 30 as a common wiring. The light-emitting element 30 is thus connected to the first wiring 21 and the second wiring 24.

Disconnecting Defective Light-Emitting Element 30x from Second Wiring 24

Subsequently, as shown in FIG. 1, each light-emitting element 30 is inspected to detect defects. If a defective light-emitting element 30x is detected, a disconnection portion 24c is formed by selectively removing a portion of the second wiring 24 that surrounds the light-emitting element 30x by, for example, laser process. Hence, the light-emitting element 30x is disconnected from the second wiring 24. Thereafter, roughening for mat-finish or blackening for black film formation is performed on the surfaces of the electrode 22 and the second wiring 24 so as to reduce light reflectance on the electrode 22 and the second wiring 24. This may improve a contrast of a screen. As above, the display device 1 according to the present embodiments is manufactured.

Next, effects of the present embodiment will be described.

In the display device 1 according to the present embodiment, each light-emitting element 30 includes the second electrode 33 disposed on at least a portion of the lateral surfaces 31b of the semiconductor member 31. Also, the second wiring 24 is disposed on a region of the upper surface 23a of the resin member 23 excluding an exposed portion of the light-emitting element 30. This configuration can allow the second electrode 33 of each light-emitting element 30 to be in contact with the second wiring 24 even if a location and angle of the light-emitting element 30 somewhat deviate from a design value. Hence, the light-emitting element 30 can be electrically connected to the first wiring 21 and the second wiring 24 as far as the precision of alignment is ensured such that the first electrode 35 of the light-emitting element 30 is in contact with the first wiring 21, and excessive precision is not needed for mounting the light-emitting element 30 on the substrate 20. In this configuration, large margins of location and angle can be secured when the light-emitting element 30 is mounted on the substrate 20. As a result, the display device 1 can be easily manufactured at low cost.

In the present embodiment, with the second electrode 33 disposed on the lateral surface of the light-emitting element 30, the second electrode 33 does not necessarily cover an upper surface of the semiconductor member 31. Hence light emitted upward from the semiconductor member 31 may be effectively used.

Further, the second wiring 24 is formed of metals as a main material. Such second wiring 24 can have low resistance compared with a case in which wirings are formed of an electro-conductive transparent material such as indium-tin-oxide (ITO). Hence, the display device 1 has a high power-utilization efficiency.

Further, in the display device 1, each sub-pixel 11 includes two light-emitting elements 30. The two light-emitting element 30 are connected between the first wiring 21 and the second wiring 24 in parallel connection. If both of two light-emitting elements 30 disposed on certain sub-pixel 11 work properly, electric current flows through the two light-emitting elements 30 in parallel. On the contrary, if one of the two light-emitting elements 30 has a defect, the defective light-emitting element 30x is separated from the second wiring 24 by forming the disconnection portion 24c in the second wiring 24. This can suppress a defect of the light-emitting element 30 from directly causing a defect of the sub-pixel 11 that exhibits, for example, a bright point or a dark point. In this case, as the defective light-emitting element 30x is disconnected from the electric circuit, a current flowing through the other light-emitting element 30 having no such defect becomes twice as high as usual, and therefore, the light-emitting element 30 emits light about twice as bright as usual. Hence, brightness of light emitted from the whole sub-pixel 11 is substantially the same regardless of with or without a defective light-emitting element 30x in the sub-pixel 11.

According to the present embodiment, the plurality of light-emitting elements 30 disposed in one sub-pixel 11 can serve as backups to each other, so that the sub-pixel 11 can operate properly even if one of the light-emitting elements 30 has a defect. This can improve yields and reduce the cost in manufacturing the display device 1. Each sub-pixel 11 can include three or more light-emitting elements 30.

Second Embodiment

Next, a second embodiment will be described.

Figure 8:
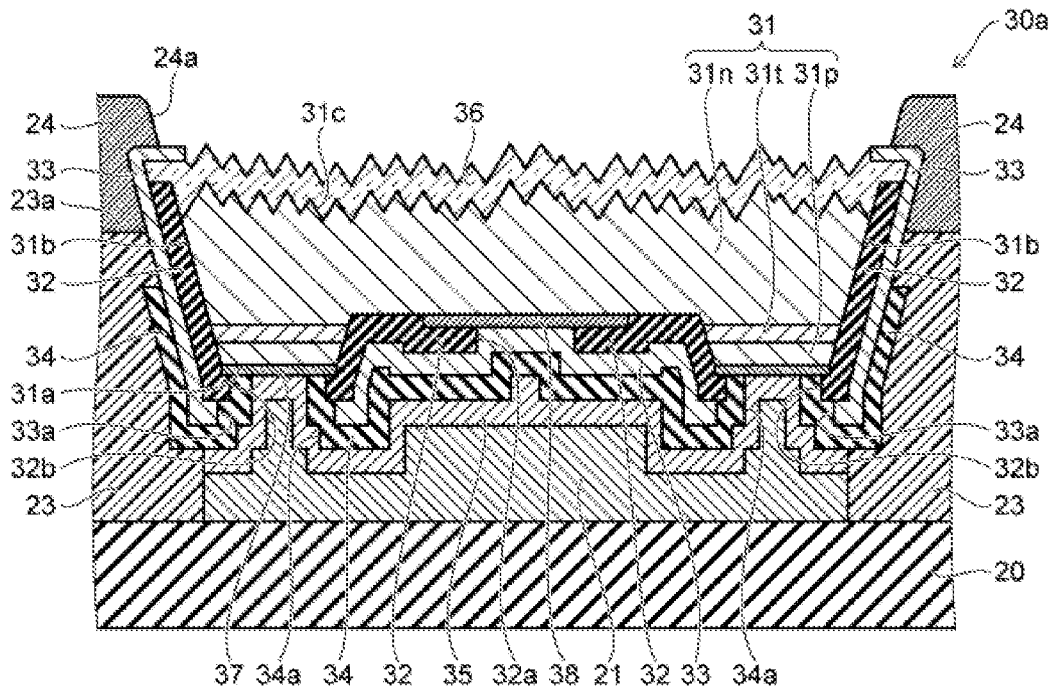
FIG. 8 is a schematic end view illustrating a light-emitting element of a display device according to a second embodiment.

FIG. 8 is a schematic end view illustrating a light-emitting element of a display device according to the present embodiment.

As shown in FIG. 8, the display device according to the present embodiment includes a light-emitting element 30a.

In the light-emitting element 30a, the second electrode 33 reaches to a peripheral portion of an upper surface 31c of the semiconductor member 31. This configuration can ensure connection of the second wiring 24 to the second electrode 33. The structure, the manufacturing method, and the effect other than the above according to the present embodiment are the same as or similar to the structure, the manufacturing method, and the effect according to the first embodiment.

Third Embodiment

Next, a third embodiment will be described.

Figure 9:
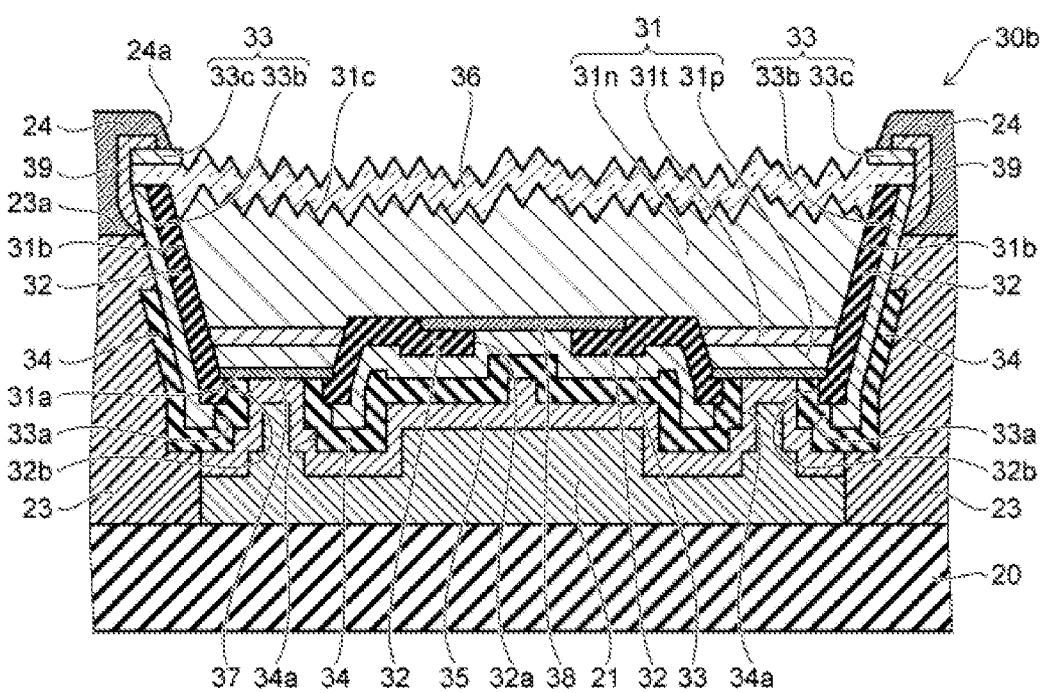
FIG. 9 is a schematic end view illustrating a light-emitting element of a display device according to a third embodiment.

FIG. 9 is a schematic end view illustrating a light-emitting element of a display device according to the present embodiment.

As shown in FIG. 9, the display device according to the present embodiment includes a light-emitting element 30b. In the light-emitting element 30b, the second electrode 33 is divided into a first portion 33b and a second portion 33c. The first portion 33b is disposed on a lower surface 31a and one or more lateral surfaces 31b of the semiconductor member 31. The second portion 33c is disposed on the peripheral portion of an upper surface 31c of the semiconductor member 31. The second portion 33c is separated from the first portion 33b. The light-emitting element 30b includes a metal plated layer 39. The metal plated layer 39 electrically connects the first portion 33b to the second portion 33c of the second electrode 33. The metal plated layer 39 is formed, for example, by electroplating.

According to the present embodiment, even if the second electrode 33 is divided into the first portion 33b and the second portion 33c depending on a condition of forming the second electrode 33, forming the metal plated layer 39 allows the second portion 33c to serve as a portion of the second electrode 33. The structure, the manufacturing method, and the effect other than the above according to the present embodiment are the same as or similar to the structure, the manufacturing method, and the effect according to the first embodiment.

Fourth Embodiment

Next, a fourth embodiment will be described.

FIG. 10 is a schematic top view illustrating a light-emitting element of a display device according to the present embodiment.

As shown in FIG. 10, the display device according to the present embodiment includes a light-emitting element 30c. In the light-emitting element 30c, the second electrode 33 is disposed on only one portion of a lateral surface 31b of the semiconductor member 31. This also allows the second electrode 33 to be connected to the second wiring 24. The structure, the manufacturing method, and the effect other than the above according to the present embodiment are the same as or similar to the structure, the manufacturing method, and the effect according to the first embodiment.

The shape and the position of the second electrode 33 are not limited to the above embodiments. The configuration only needs to be such that the second electrode 33 is disposed on a portion of the lateral surface 31b of the semiconductor member 31, a portion of the second electrode 33 is exposed on the resin member 23, and the exposed portion is electrically connected to the second wiring 24. For example, the second electrode 33 can be disposed on three lateral surfaces 31b of the semiconductor member 31, disposed on two lateral surfaces 31b opposing each other, disposed on two lateral surfaces 31*b* intersecting each other, or disposed on a portion of each of one or more lateral surfaces 31*b*.

The display device according to the present disclosure can be used for, for example, a device that visually displays information. Such a display includes a portable electronic device, a television receiver, and a display for many people.

The invention claimed is:

1. A method of manufacturing a display device, the method comprising:
   providing a substrate and at least one light-emitting element, wherein
      the substrate comprises sub-pixels, a first wiring disposed for the sub-pixels, and an electrode disposed between the sub-pixels, and
      the at least one light-emitting element comprises a lower surface, a lateral surface, a first electrode disposed on the lower surface, and a second electrode disposed on at least a portion of the lateral surface;
   mounting the at least one light-emitting element on the substrate and electrically connecting the first electrode to the first wiring;
   forming a resin member on the substrate, the resin member covering the at least one light-emitting element and the electrode;
   exposing an upper portion of the at least one light-emitting element from an upper surface of the resin member such that a portion of the second electrode is exposed by removing an upper portion of the resin member, and exposing at least a portion of the electrode from a lateral surface of the resin member by removing a portion of the resin member, the electrode being disposed at an elevation lower than the lower surface of the at least one light-emitting element; and
   forming a second wiring on a region of the upper surface of the resin member excluding a portion of the at least one light-emitting element exposed from the resin member and electrically connecting the second wiring to the second electrode and to the electrode.

2. The method of manufacturing a display device according to claim 1,
   wherein the at least one light-emitting element includes a semiconductor member, and
   wherein the second electrode is disposed around the semiconductor member in a top view.

3. The method of manufacturing a display device according to claim 2, wherein the at least one light-emitting element has a quadrangular shape in a top view.

4. The method of manufacturing a display device according to claim 2,
   wherein the at least one light-emitting element comprises a plurality of light-emitting elements, and
   wherein two or more of the light-emitting elements are mounted on one of the sub-pixels.

5. The method of manufacturing a display device according to claim 4, wherein the at least one light-emitting element comprises a defective light-emitting element, and the method further comprising,
   disconnecting the defective light-emitting element from the second wiring.

6. The method of manufacturing a display device according to claim 1,
   wherein the at least one light-emitting element includes a semiconductor member having an upper surface, and
   wherein the second electrode is disposed also on a portion of the upper surface of the semiconductor member.

7. The method of manufacturing a display device according to claim 6, wherein the at least one light-emitting element has a quadrangular shape in a top view.

8. The method of manufacturing a display device according to claim 6,
   wherein the at least one light-emitting element comprises a plurality of light-emitting elements, and
   wherein two or more of the light-emitting elements are mounted on one of the sub-pixels.

9. The method of manufacturing a display device according to claim 8, wherein the at least one light-emitting element comprises a defective light-emitting element, and the method further comprising,
   disconnecting the defective light-emitting element from the second wiring.

10. The method of manufacturing a display device according to claim 1, wherein the at least one light-emitting element has a quadrangular shape in a top view.

11. The method of manufacturing a display device according to claim 1,
   wherein the at least one light-emitting element comprises a plurality of light-emitting elements, and
   wherein two or more of the light-emitting elements are mounted on one of the sub-pixels.

12. The method of manufacturing a display device according to claim 11, wherein the at least one light-emitting element comprises a defective light-emitting element, and the method further comprising,
   disconnecting the defective light-emitting element from the second wiring.

13. The method of manufacturing a display device according claim 1,
   wherein the at least one light-emitting element comprises a plurality of light-emitting elements,
   wherein in the step of forming the resin member, the resin member covers the plurality of light-emitting elements mounted on the plurality of sub-pixels, and
   wherein in the step of exposing the upper portion, the resin member is divided into each of the sub-pixels.

* * * * *